(12) United States Patent
Chann et al.

(10) Patent No.: US 9,093,822 B1
(45) Date of Patent: Jul. 28, 2015

(54) MULTI-BAND CO-BORE-SIGHTED SCALABLE OUTPUT POWER LASER SYSTEM

(75) Inventors: Bien Chann, Merrimack, NH (US); Robin Huang, North Billerica, MA (US)

(73) Assignee: TeraDiode, Inc., Wilmington, MA (US)

( * ) Notice: Subject to any disclaimer, the term of this patent is extended or adjusted under 35 U.S.C. 154(b) by 0 days.

(21) Appl. No.: 13/332,326

(22) Filed: Dec. 20, 2011

Related U.S. Application Data

(60) Provisional application No. 61/424,779, filed on Dec. 20, 2010, provisional application No. 61/429,377, filed on Jan. 3, 2011, provisional application No. 61/532,728, filed on Sep. 9, 2011.

(51) Int. Cl.
*H01S 3/08* (2006.01)
*H01S 5/40* (2006.01)

(52) U.S. Cl.
CPC .................................. *H01S 5/4087* (2013.01)

(58) Field of Classification Search
USPC ......................... 372/102, 99, 98, 97
See application file for complete search history.

(56) References Cited

U.S. PATENT DOCUMENTS

2006/0092993 A1* 5/2006 Frankel ........................... 372/18
2008/0037608 A1* 2/2008 Zhou et al. .................. 372/50.11

* cited by examiner

*Primary Examiner* — Kinam Park
(74) *Attorney, Agent, or Firm* — Morgan, Lewis & Bockius LLP

(57) ABSTRACT

A multi-band scalable output power laser system configured to have high brightness and output power in each band is accomplished by combining multiple laser modules, with each producing at least one band, and wherein at least one of the laser modules is based on a wavelength beam combining (WBC) system, into a multi-band free-space cavity.

8 Claims, 5 Drawing Sheets

MULTI-BAND CO-BORE-SIGHTED SCALABLE OUTPUT POWER LASER SYSTEM

CROSS-REFERENCE TO RELATED APPLICATIONS

This application claims priority under 35 U.S.C. §119 to the following U.S. Provisional patent applications, each of which is hereby incorporated by reference in its entirety: U.S. Ser. No. 61/424,779 filed Dec. 20, 2010; U.S. Ser. No. 61/429,377 filed Jan. 3, 2011; U.S. Ser. No. 61/532,728 filed Sep. 9, 2011.

BACKGROUND OF THE INVENTION

1. Field of the Invention

The present embodiments relate generally to laser systems and more particularly to laser system modules that combine multiple wavelength bands and scale output power.

2. Description of the Prior Art

Wavelength beam combining (WBC) is a method for scaling the output power and brightness from laser diode bars, stacks of diode bars, as well as other lasers arranged in one or two-dimensional arrays.

WBC methods have been developed to combine beams along the slow dimension of each emitter as well as the fast dimension of each emitter. See for example, U.S. Pat. Nos. 6,192,062, 6,208,679 and 2010/0110556 A1. In prior patents, U.S. Pat. Nos. 6,192,062 and 6,208,679, beam combining is performed along the array dimension. These arrays and stacks may be increased to produce several kilowatts of power. However, these systems are designed to produce a single narrow-bandwidth high-brightness output beam profile. In some applications, it is desirable to have a broader bandwidth output while still maintaining high power and brightness. In some applications it is desirable to have a high-power spectrally broad multi-band laser system comprised of a plurality of high-brightness bands centered around a central wavelength, and where each of the bands are overlapped along a single optical pathway. A co-bore-sighted laser output that is spectrally broad and spatially compact has many uses in both commercial and military applications.

The following application seeks to solve the problems stated.

SUMMARY OF THE INVENTION

A multi-band laser system has been developed to combine radiation bands from multiple laser modules. In one embodiment, the multi-band laser system includes more than one laser module, a dispersive element, and a partially-reflective output coupler. In this embodiment, each laser module emits a radiation band with a unique center wavelength and spectral bandwidth, the radiation bands are combined at a region of overlap. The dispersive element is placed at the region of overlap, receives the radiation bands, and transmits the bands as a combined multi-band beam. The output coupler receives and transmits the multi-band beam while reflecting a portion of the multi-band beam back into each dispersive element.

Another embodiment includes a multi-band laser system that has a first and second laser module, a dichroic mirror, and a partially-reflective output coupler. The first laser module includes at least one laser element which creates a first band of radiation. The second laser module includes multiple laser elements and a dispersive element. The laser elements in the second laser module each emit a unique wavelength. All of the unique wavelengths are combined at a common region of overlap on the dispersive element. The dispersive element receives and transmits the combined wavelengths and a second band is formed. The second band is comprised of multiple wavelengths centered around a central wavelength and having a specified spectral bandwidth. The dichroic mirrors receive the first and second bands and form a multi-band beam by transmitting each band along an optical path. The partially-reflective output coupler transmits the multi-band beam while reflecting a portion of the multi-band beam back into each module, forming a free-space cavity.

Also disclosed herein is a method for creating a scalable multi-band laser system by providing laser modules that each produce a unique radiation band. At least one of the modules is scalable to an output power of up to and greater than a kilowatt. The emitted radiation bands are combined along a common optical path using at least one dichroic mirror, wherein a multi-band beam is formed. The multi-band beam is then transmitted through an output coupler while a portion of the multi-band is reflected toward the dichroic mirrors.

DETAILED DESCRIPTION OF THE PREFERRED EMBODIMENT

Aspects and embodiments relate generally to the field of scaling laser sources to high-power and high-brightness using a free-space cavity and, particularly, to methods and apparatus for a free-space cavity beam combining using both one-dimensional or two-dimensional laser sources. More particularly, to embodiments having a plurality of laser modules producing radiation bands that are combined into a single free-space cavity system that produces a multi-band output, wherein each of the bands are scalable.

In one embodiment a free-space cavity system includes one-dimensional or two-dimensional laser elements, an optical system, a dispersive element, and a partially reflecting element. An optical system is one or more optical elements that perform two basic functions. The first function is to overlap all the laser elements along the beam combining dimension onto a dispersive element. The second function is to make sure all the elements along the non-beam combining dimension are propagating normal to the output coupler. Care must be taken to ensure that the optical system introduces as little loss as possible. As such, these two functions will enable a single resonance cavity for all the laser elements.

In another embodiment a WBC free-space cavity system includes wavelength stabilized one-dimensional or two-dimensional laser elements, an optical system, and a dispersive element. One-dimensional or two-dimensional wavelength stabilized laser elements, with unique wavelength, can be accomplished using various means, including: laser elements with feedback from wavelength chirped Volume Bragg grating, distributed feedback (DFB) laser elements, or distributed Bragg reflector (DBR) laser elements. Aspects and embodiments further relate to high-power and/or high-brightness multi-wavelength free-space cavity lasers that generate an overlapping or coaxial beam ranging from a very low output power to hundreds of watts or even to megawatts of output power.

For purposes of this application, a free-space cavity includes a laser emitter, which is comprised of an optical gain medium and back facet reflective surface, and a secondary mirror or partially-reflective output coupler placed at a distance from the laser emitter. Resonance occurs between the secondary mirror or output coupler and the back facet reflective surface. Free-space cavities described herein may also include additional optical elements placed between the laser emitter and output coupler.

Figure 1A:
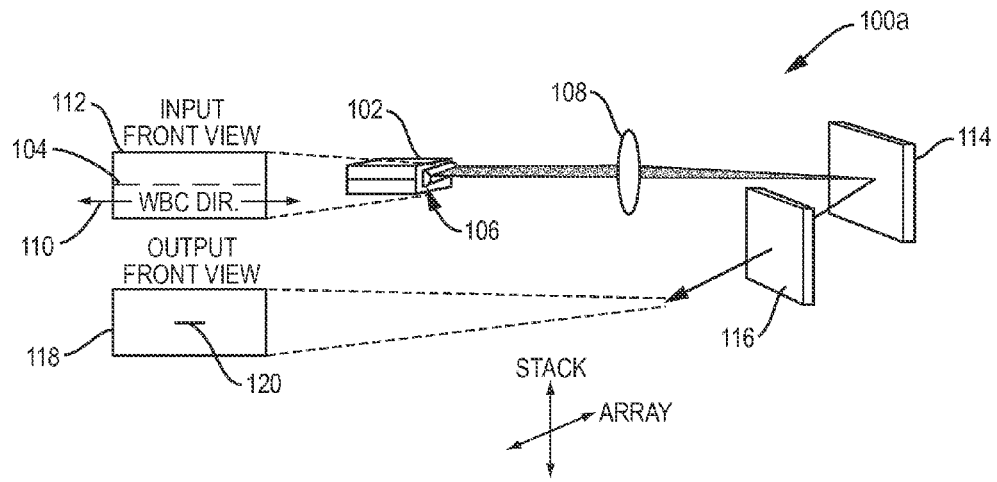
FIG. 1A is a schematic of a wavelength beam combining (WBC) method along the slow-diverging dimension of each emitter along a single row of emitters.

FIG. 1A illustrates a basic WBC architecture. This is the basis of U.S. Pat. Nos. 6,192,062 and 6,208,679. In this particular illustration, WBC is performed along the array dimension or slow dimension for broad-area emitters. Individual beams 104 are illustrated in the figures by a dash or single line, where the length or longer dimension of the beam represents the slow diverging dimension for broad-area emitters and the height or shorter dimension represents the fast diverging dimension. As shown, diode bar 102 has four emitters. The emitters are aligned in a manner such that the slow dimension ends of each emitted beam 104 are aligned to one-another side-by-side along a single row, array or array dimension. It is contemplated that any lasing elements may be used and in particular laser elements with broad gain bandwidth. Typically a collimation lens 106 is used to collimate each beam along the fast diverging dimension. In some cases the collimation optics may be composed of separate fast axis collimation lenses and slow axis collimation lenses. Typically, transform optic 108 is used to combine each beam along the WBC dimension 110 as shown by the input front view 112. Transform optic 108 may be a cylindrical or spherical lens or mirror. The transform optic 108 then overlaps the combined beam onto a dispersive element 114 (here shown as a reflecting diffraction grating). The combined beam is then transmitted as a single output profile onto an output coupler 116. A resonator is formed between the back facet or reflecting surface of the laser elements, which include an optical gain medium, and the partially-reflecting output coupler 116. This output coupler then transmits the combined beams 120, as shown by the output front view 118.

The output coupler 116 may be a partially reflective mirror, or have a surface or optical coating, acting as a common secondary mirror or reflection surface for all the laser elements of diode array 102. A portion of the emitted beams is reflected back into the optical gain and/or lasing portion of diode array 102 in this free-space cavity system 100a. A free-space cavity is generally a lasing system where a secondary mirror or partially-reflective output coupler is displaced at a distance away from the emission aperture or facet (not labeled) of each laser emitter. In a free-space cavity additional optical elements may be placed between the emission aperture or facet and the partially-reflective output coupler 116 or secondary reflective surface.

Figure 1B:
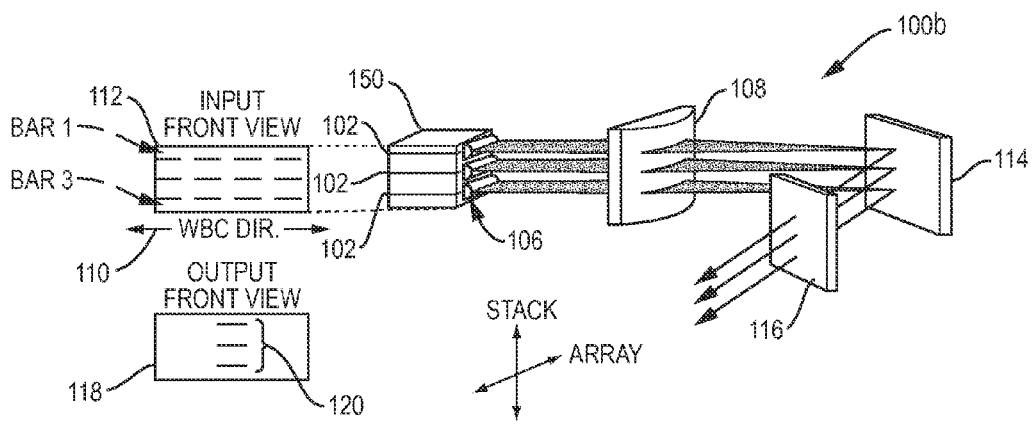
FIG. 1B is a schematic of a WBC method along the slow-diverging dimension of each emitter along a two-dimensional array of emitters.

Similarly, FIG. 1B illustrates a stack of laser diode bars each having four emitters where those bars are stacked three high. Like FIG. 1A, the input front view 112 of FIG. 1B, which in this embodiment is a two-dimensional array of emitters, is combined to produce the output front view 118 or a single column of emitters 120. The emitted beams in free-space cavity 100b were combined along the array dimension. Here, transform optic 108 is a cylindrical lens used to combine the beams along the array. However, an optical system, or combination of optical elements, can be arranged so all the beams overlap onto the dispersive element and ensure that all the beams along the non-beam-combining dimension are propagating normal to the output coupler. A simple example of such an optical system may comprise a single cylindrical lens with the appropriate focal length along the beam-combining dimension and two cylindrical lenses that form a focal telescope along the non beam-combining dimension, wherein the optical system projects images onto the partially reflecting mirrors. Many variations of this optical system can be designed to accomplish the same functions.

The array dimension FIG. 1B is also the same axis as the slow dimension of each emitted beam in the case of multi-mode diode laser emitters. Thus, this WBC system may also be called slow axis combining, where the combining dimension is the same dimension as the slow diverging axis of each of the emitted beams.

Figure 1C:
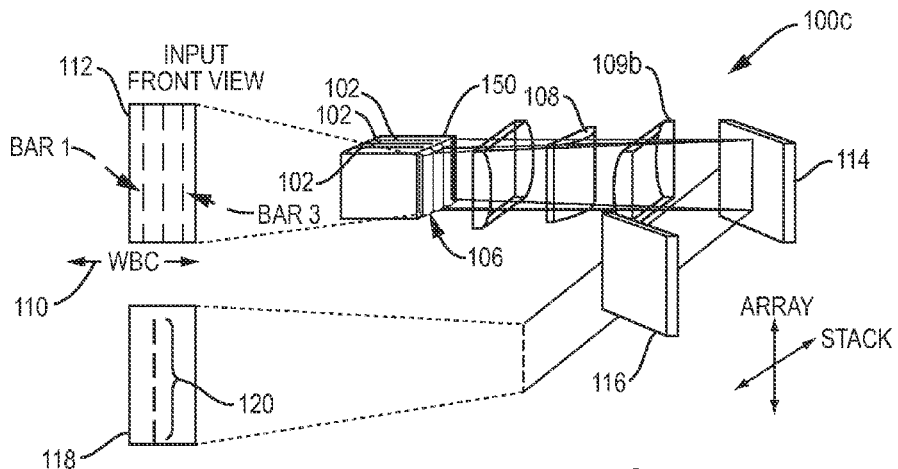
FIG. 1C is a schematic of a WBC system including an optical rotator selectively rotating a one-dimensional array of beams and combining each beam along its fast-diverging axis.

FIG. 1C shows a schematic of WBC system 100c with an optical rotator 105 placed after collimation lenses 106 and before the transform optic 108. It should be noted the transform optic 108 may be comprised of a number of lenses or mirrors or other optical components. The optical rotator 105 individually rotates the fast and slow dimension of each emitted beam shown in the input front view 112 to produce the re-oriented front view 107. It should be noted that the optical rotators can selectively rotate each beam individually irrespective of the other beams or can rotate all the beams through the same angle simultaneously. It should also be noted that a cluster of two or more beams can be rotated simultaneously. The resulting output after WBC is performed along the array dimension is shown in output front view 118 as a single emitter. Dispersive element 114 is shown as a reflection diffraction grating, but may also be a dispersive prism, a grism (prism+grating), transmission grating, or Echelle grating. The embodiment illustrated in FIG. 1C shows only four laser emitters; however, this system could take advantage of a laser diode array that included many more elements, e.g., 49. This particular embodiment shows a single bar at a particular wavelength band (example at 976 nm) but in actual practice it can be composed of multiple bars, all at the same particular wavelength band, arranged side-by-side. Furthermore, multiple wavelength bands (example 976 nm, 915 nm, and 808 nm), each band comprising multiple bars, can be combined in a single cavity. WBC systems that combine across the fast axis dimension of each emitter are generally less susceptible to degradation caused by pointing errors.

Techniques to minimize pointing errors from laser arrays in WBC lasers, for both slow and fast axis beam, include: using arrays of cylindrical lenses with an array pitch matched to the pitch of the corresponding array of emitters. Pointing errors include errors due to laser-array "smile" or collimating errors. These errors are formed as a result of mechanical deflection of diode bar, other stress, or manufacturing errors. The array of cylindrical lenses (not shown) used in conjunction with FAC/SAC lenses redirects the off-axis propagating beam to propagate along the optical axis of the system. As a result, when radiation is reflected back from an output coupler it will be redirected back into each individual emitter including those with a pointing error. The redirected radiation or light stabilizes the unique wavelength admitted causing the system to be more robust. Other techniques utilize a pair of cylindrical lenses along the slow-diverging dimension, fast-diverging dimension or both. Similarly, the pair of cylindrical lenses helps to redirect pointing error to propagate normal and properly stabilize each emitter. A Cylindrical lens array and/or pair of cylindrical lenses may also be used with 1-D or 2-D arrays. Additionally, some embodiments are configured to incorporate an interdependent three-lens system where a spherical transform lens and cylindrical lens cooperatively perform the function of compensating for pointing error.

Another exemplary embodiment (not shown) may include the implementation of a system similar to FIG. 1C except that a stack of laser arrays form a 2-D input profile. For example, the exemplary embodiment not shown may similarly include collimation lens(es), optical rotator, transform optic, dispersive element, and an output coupler with a partially reflecting surface. Each of the beams may be individually rotated by the optical rotator to form an after rotator profile. Similar to FIG. 1C, the WBC dimension is along the array dimension, but with the rotation, each of the beams will be combined across their respective fast axis. Fast axis WBC produces outputs with very narrow line widths and high spectral brightness. These are usually ideal for industrial applications such as welding. After the transform optic overlaps the rotated beams onto the dispersive element a single output profile is produced and partially reflected back through the cavity into the laser elements.

Nomenclature, used to define the term "array dimension," generally refers to one or more laser elements placed side by side where the array dimension is also along the slow axis. One reason for this nomenclature is diode bars with multiple emitters are often arranged in this manner where each emitter is aligned side by side such that each beam's slow dimension is along a row or array. For purposes of this application, an array or row generally refers to individual emitters or beams arranged across a single dimension; however, an array may also include multiple rows or a two-dimensional grouping of beams or emitters. The individual slow diverging dimension of each emitter of an array may be aligned along the same array dimension; however it is contemplated the fast-diverging dimension of each emitter may also be aligned along the array dimension or be manipulated (optically or mechanically) to be aligned as such. This is important because some embodiments described herein individually rotate the slow dimension of each beam aligned along an array or row.

In some embodiments it is useful to note that the array dimension and the slow dimension of each emitted beam are initially oriented across the same axis; however, those dimensions, as described in this application, may become oriented at an offset angle with respect to each other. In other embodiments, the array dimension and only a portion of the emitters arranged along the array or perfectly aligned the same axis at a certain position in a WBC system. For example, the array dimension of a diode bar may have emitters arranged along the array dimension, but because of smile (often a deformation or bowing of the bar) individual emitters' slow emitting dimension is slightly skewed or offset from the array dimension.

Figure 2:
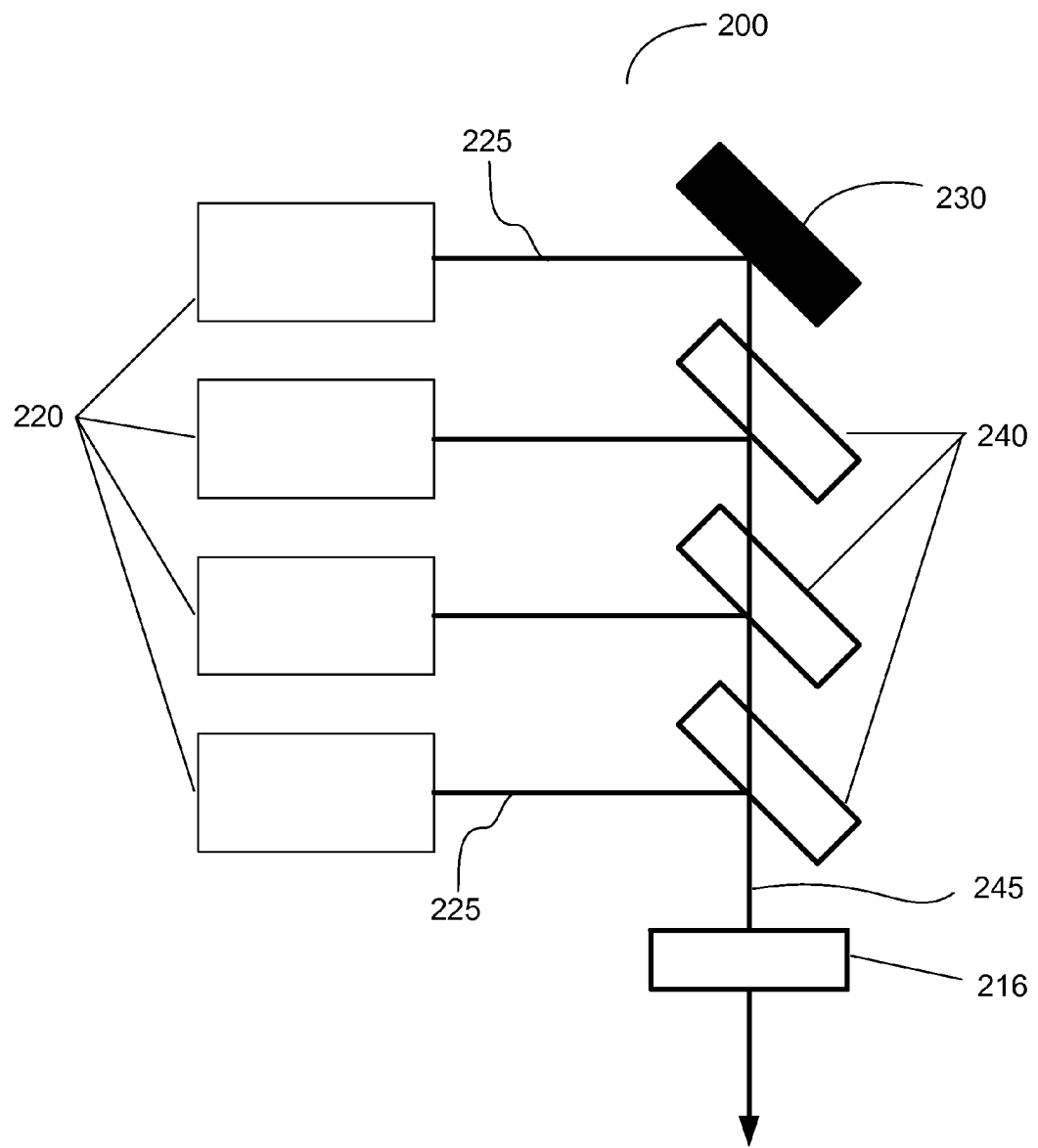
FIG. 2 illustrates a spectrally multiband laser system comprising several laser modules in a common cavity system.

The previous WBC systems and embodiments described above, as well as others described below are generally ideal for building a spectrally broadband or multi-band and spatially compact laser systems. WBC lasers enable high power, beam quality, high brightness, and wavelength stability. By overlapping and aligning the bands from a plurality of WBC modules co-linearly on a common output coupler, a high brightness co-bore-sighted multi-band laser system may be achieved. One embodiment of such a system is illustrated in FIG. 2. Laser system 200 is a multi-band system comprising a plurality of laser modules 220; each producing at least one unique band output 225. Band output 225 is comprised of a central wavelength that has a spectral bandwidth anywhere from sub-nanometer width to hundreds of nanometers in width. In some instances the spectral bandwidth may even be as wide as a micron. Each of the laser modules 220 share a common partially-reflective output coupler 216 that provides feedback to each of the laser modules 220. As shown in laser system 200, output 225 from each laser module 220 are aligned and overlaid along a common optical axis using a combination of broadband reflecting mirrors 230 and dichroic reflecting mirrors 240. The dichroic mirrors being configured to reflect a particular band output or range of wavelengths.

As mentioned, one possible configuration for laser module 220 has been previously described in FIG. 1A, where the output coupler 116 shown is removed and replaced with output coupler 216 as shown in FIG. 2. The individual laser elements 102 are comprised of an optical gain medium and a highly reflective back facet or mirror. The dispersive element 114 is configured to accept a certain wavelength, or band of wavelengths, and to act as a filter to stabilize each of the individual laser emitters 102 by providing feedback reflected from the common output coupler 216. Thus, the output 225 in such a configuration would be a discrete high-brightness spatially compact multi-wavelength beam. One way of altering the band output 225 having a unique central wavelength and spectral bandwidth is to alter the type of dispersive element 114 and/or the angle by which each emitted beam overlaps onto the dispersive element 114. Thus, the same optical configuration with distinctive dispersive elements may produce various center wavelengths outputs each having a particular spectral band associated therewith. Altering the type of laser emitter and the optical gain of the laser emitter are methods that may be used to alter the center wavelength, though the dispersive element to be configured to accept such a particular wavelength.

TABLE 1

A multi-band system having four bands

| | Wavelength (microns) | Grating (l/mm) | Transform lens (mm) | Spectral Bandwidth (nm) |
|---|---|---|---|---|
| Band 1 | 2 | 900 | 75 | 65 |
| Band 2 | 3 | 600 | 75 | 100 |
| Band 4a | 4 | 400 | 75 | 150 |
| Band 4b | 4.5 | 400 | 75 | 200 |

Table 1 shows an exemplary multi-band system producing four bands: Band 1, Band 2, Band 4a, and Band 4b. Each band has a corresponding center wavelength (as shown in Table 1 all of these wavelengths are in the infrared range (IR) of the electromagnetic spectrum). Each of the four bands is created in a laser module having a diffraction grating that has a specified number of lines per millimeter (l/mm). The third column shows the focal length of a transform lens used to combine a plurality of emitters onto a respective diffraction grating. The fourth column shows the spectral bandwidth produced for each band. Thus, Band 4b, which has a center wavelength of 4.5 microns has a spectral range from 4.4 microns to 4.6 microns for a total spectral bandwidth of 200 nm.

It should be noted that the same type of dispersive element, e.g. 400 l/mm, may be capable of producing multiple bands. Therefore, in Table 1, where Band 4a and Band 4b are configured to use the same type of diffraction grating, 400 l/mm, it will be discussed later that a single diffraction grating contained with a single laser module may produce multiple band outputs. However, each dispersive element generally has a limited spectral band output range, wherein it may be necessary to have multiple unique diffraction gratings to create a desired multi-band output such as the one described in Table 1.

With each laser module 220 producing at least one unique band output 225 centered around a central wavelength, dichroic mirrors 240 are used to overlap each output 225 into a single multi-band output beam 245 with each band being co-bore-sighted or arranged co-linearly along the same optical path. Dichroic mirrors 240 are coated to reflect the corresponding band(s) with their center wavelength and associated spectral bandwidth produced from a corresponding laser module toward output coupler 216. Additionally, the dichroic mirrors allow feedback from the output coupler 216 to reflect back into the corresponding laser module while transmitting non-corresponding bands to pass through to their corresponding dichroic mirror or laser module. Thus, a common cavity is created, where: optical gain occurs in each of the laser elements; resonance occurs between the back facet of each laser emitter and common output coupler 216; and the produced multi-band output 245 is stabilized at the laser module level through means of the dispersive element associated with each laser module 220. It is contemplated, and shown herein, that not every laser module requires a dispersive element. For example, it is within the scope of this application that one laser module may be comprised of a single laser emitter that is combined with another laser module comprising a plurality of laser emitters, wherein both a single laser emitter and the plurality of laser emitters share the same common output coupler and are overlaid by means of dichroic mirrors.

Figures 3A, 3B:
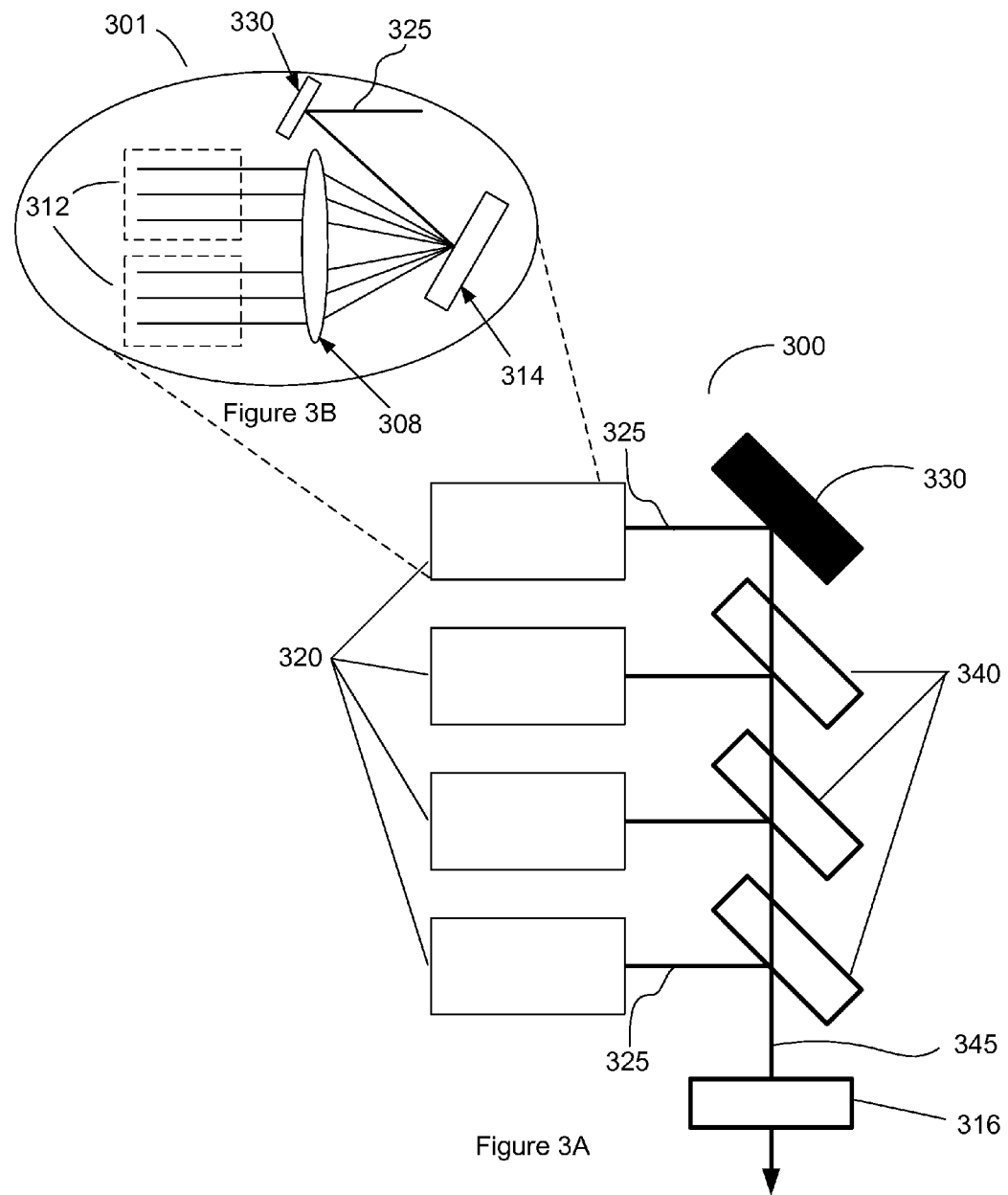
FIGS. 3A-B illustrate a spectrally multiband laser system comprising several laser modules in a common cavity system where individual modules may produce multiple spectral bandwidth outputs.

Another embodiment of a multiband output laser system is illustrated in FIGS. 3A-B. The multi-band output laser system 300 shown is comprised of four laser modules 320. However unlike the previous embodiment, laser modules 320 may be configured to produce a multi-band output 325 having more than one center wavelength that is later combined with the output 325 of other laser modules 320 to form the combined multi-band output beam 345. Similar to the above described embodiments, laser system 300 also comprises a plurality of dichroic mirrors 340 and a single broadband reflective mirror 330. It should be noted that reflective mirror 330 may be removed and the top laser module 320 may be repositioned in a manner that directs its output 325 along the same optical path that forms the combined multiband output beam 345.

FIG. 3B illustrates one such laser module 301 configured to produce multiple bands each having a spectral bandwidth that are co-linearly aligned. E.g. output 325 may be comprised of two center wavelengths each having a respective spectral bandwidth, such as Band 4a and 4b shown in Table 1. In order to accomplish multiple center wavelengths, dispersive element 314 will need to be configured so as to receive and transmit each desired center wavelength. An array of emitters 312 are configured such that a portion of the emitters produce unique wavelength(s) around the first center wavelength, while a second portion of emitters produce unique wavelength(s) around a second center wavelength.

Laser module 301, as shown, is comprised of an array of laser emitters 312, each emitting a unique wavelength. Transform lens 308 combines each of the unique wavelengths onto dispersive element 314, wherein a co-propagating multi-band output beam is formed. This multi-band beam 325 may be redirected by reflective mirror 330 along the same optical path as other laser modules in the laser system 300. It should be understood that dispersive element 314, as mentioned above, may be a reflective diffraction grating. It should also be understood that another way of describing each band output is a multi-wavelength beam comprised within a specified spectral range that is centered around a central wavelength.

Figures 4A, 4B, 4C:
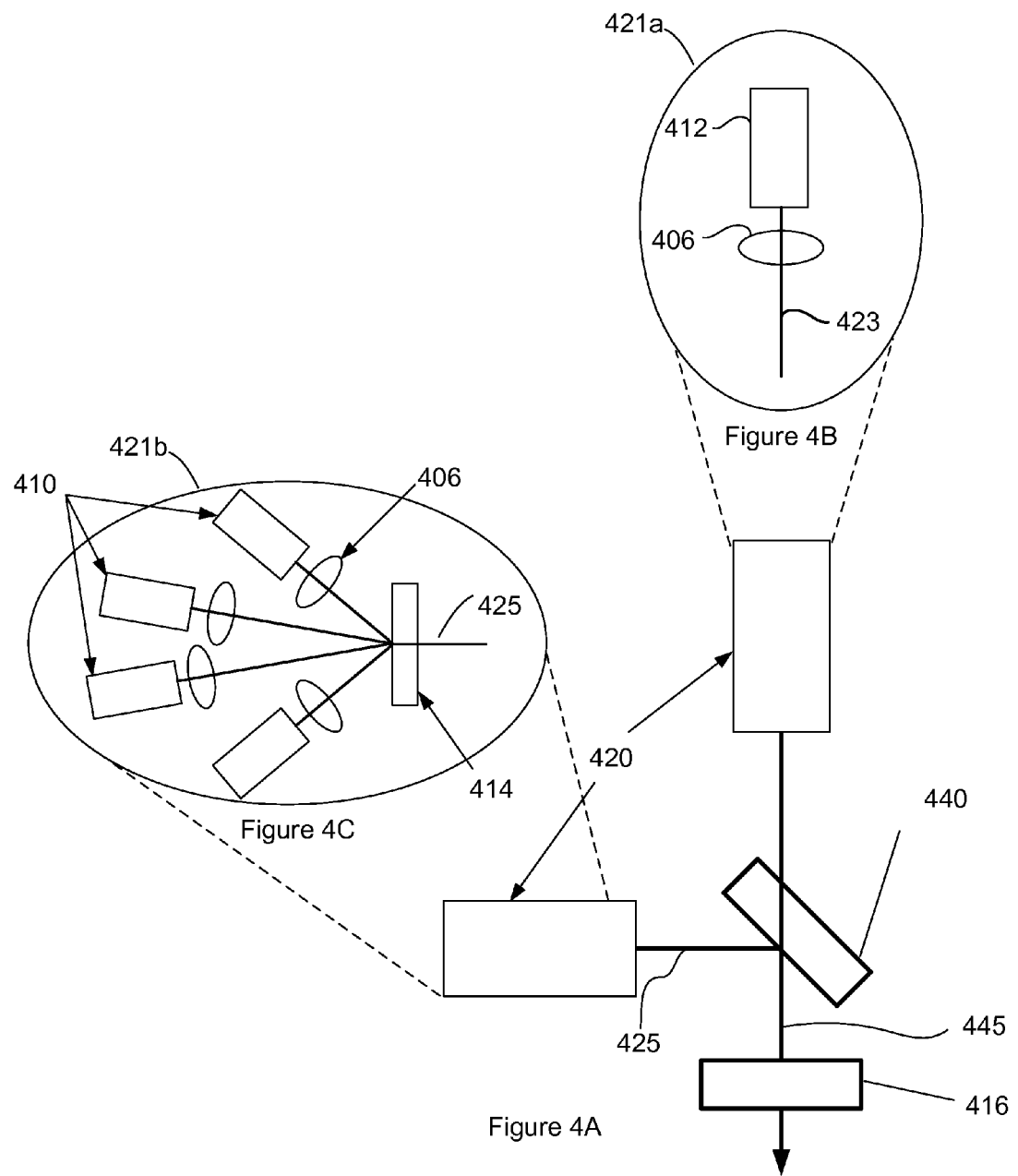
FIGS. 4A-C illustrate a spectrally multiband laser system comprising multiple laser modules in a common cavity system where some of the individual laser modules do not require a dispersive element.

In yet another embodiment illustrated in FIGS. 4A-C, a laser module comprising a single laser emitter 421a may be combined with a second laser module 421b having a plurality of laser emitters. In some of the previous embodiments described above each laser module included a transform lens and a dispersive element. However, laser module 421a as shown does not include a transform lens or dispersive element. Instead laser module 421a is comprised of a laser element 412 and an optional collimating optic 406. A resonator is still formed between a back facet (not labeled) of laser emitter 412 and common output coupler 416. Laser module 421b, illustrated in FIG. 4C, is comprised of a plurality of single emitters 410 each producing a single output beam. Similarly an optional collimating optic 406 may be positioned after each laser emitter 410. Each of the single laser emitters 410 may be mechanically and/or optically aligned such that the output beam from each emitter 410 overlaps at a common region of overlap on the dispersive element 414. Thus, a multi-beam output 425 is produced which is later combined along the same optical path as the single output beam 423 forming a combined multi-band output beam 445. Similar to previous embodiments a dichroic mirror 440 is used to transmit output beam 423 while reflecting multi-output beam 425. Each emitter 410 also forms a common resonator with an output coupler 416.

Figure 5:
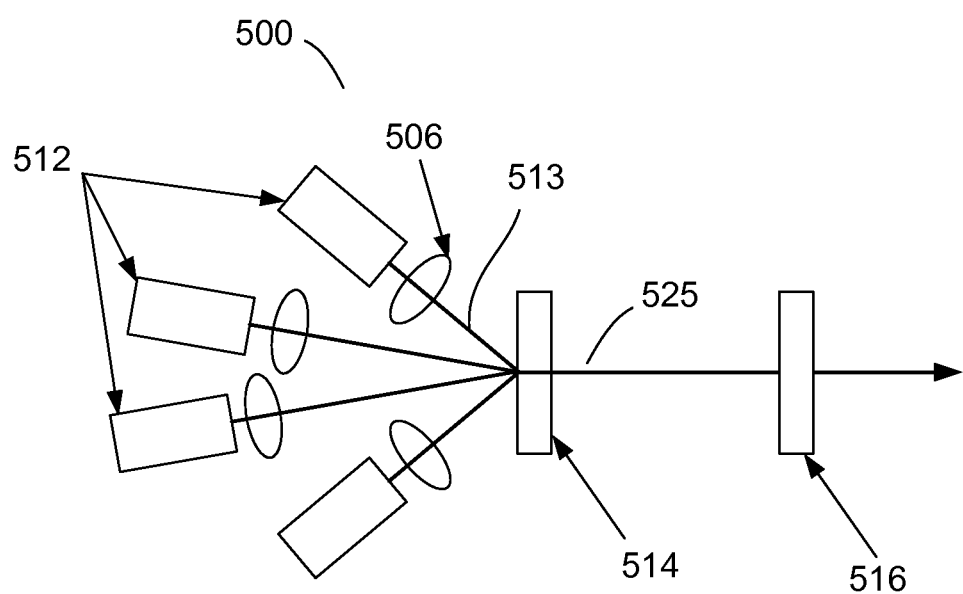
FIG. 5 illustrates an embodiment of a spectrally broadband system in a common cavity system.

Another embodiment of producing a multi-band output beam that is co-bore sighted is illustrated in FIG. 5. Multi-band laser system 500 is comprised of a plurality of single laser emitters 512, each having an optional collimating lens 506 and each having been mechanically or optically arranged so each emission beam(s) 513 overlap at a common region of overlap on dispersive element 514 thereby forming a multi-band output beam 525. The multi-output beam 525 is then transmitted to a common output coupler 516 wherein a portion of the multi-band output 525 is redirected back into each laser emitter 512, thus forming a common resonator between the individual emitters 512 and common output coupler 516. The single emitters 512 as described herein may include using quantum cascade lasers, single diode lasers, or other types of laser emitters.

Of note, multi-band laser system 500 is devoid of any dichroic mirror. However, the individual laser bands having a center wavelength produced in system 500 may be limited to the scalability of a single emitter and the multi-band output is limited to the dispersive element 514. Whereas, in other embodiments described herein the laser modules are configured to be scalable.

It should also be noted that the bands produced from each laser module described herein may have a spectral bandwidth as narrow as a few nanometers or as broad as a micron or more. When combining multiple bands together the combined overall spectral output range or broadband range created may cover a spectral range of tens of nanometers to several microns.

It is within the scope of the present application to produce a multi-band output configured to be used in white light applications. The range of white light produced from cool white to warm white may be manipulated by increasing or decreasing power and brightness in certain bands such as red, green, and blue in the visible spectrum. Alternatively, by including additional bands or more bands located at certain parts of the spectrum. Often a dispersive, diffusion or mixing element is used in conjunction with emitted multi-band laser system to properly diffuse each of the bands for creating white light.

Multi-band systems with individually scalable power of each band have many applications such as illumination, display systems, military countermeasures, illuminators, taggant lasers, rangefinders, pointer/tracker lasers, and spectral-sensor lasers to name a few. The desired broadband spectral range of the multi-band laser systems described herein is dependent upon the application. For instance, projection systems may require a broadband spectral comprised of only the visible spectrum and limited to a few hundred nanometers, whereas infrared countermeasures may require a much broader broadband spectral range of several microns. For these various applications, individual bands of a multi-band system may have high brightness and power output up to and greater than a kilowatt. The broadband output may be greater than 40 nm and up to several microns in spectral bandwidth coverage, while some of the individual bands contained therein may have sub-nanometer spectral ranges around the respective center wavelength.

Laser sources based on common "commercial, off-the-shelf" or COTS high power laser diode arrays and stacks are based on broad-area semiconductor or diode laser elements. Typically, the beam quality of these laser elements is diffraction-limited along the fast axis and many times diffraction-limited along the slow axis. While the following discussion may refer primarily to single emitter laser diodes, diode laser bars and diode laser stacks, it is to be appreciated that embodiments of the present disclosure are not limited to semiconductor or laser diodes and may be used with many different types of laser and amplifier emitters, including fiber lasers and amplifiers, individually packaged diode lasers, other types of semiconductor lasers including quantum cascade lasers (QCLs), tapered lasers, ridge waveguide (RWG) lasers, distributed feedback (DFB) lasers, distributed Bragg reflector (DBR) lasers, grating coupled surface emitting laser, vertical cavity surface emitting laser (VCSEL), and other types of lasers and amplifiers.

All of the embodiments described herein can be applied to WBC of diode laser single emitters, bars, and stacks, and arrays of such emitters. In those embodiments employing stacking of diode laser elements, mechanical stacking or optical stacking approaches can be employed. In addition, where a highly reflective (HR) coating is indicated at the facet of a diode laser element, the HR coating can be replaced by an anti-reflective (AR) coating, provided that free-space cavity optical components, including but not limited to a collimating optic and bulk HR mirror are used in combination with the AR coating. This approach is used, for example, with WBC of diode amplifier elements. Slow axis is also defined as the worse beam quality direction of the laser emission. The slow axis typically corresponds to the direction parallel to the semiconductor chip at the plane of the emission aperture of the diode laser element. Fast axis is defined as the better beam quality direction of the laser emission. Fast axis typically corresponds to the direction perpendicular to the semiconductor chip at the plane of the emission aperture of the diode laser element.

The above description is merely illustrative. Having thus described several aspects of at least one embodiment of this invention including the preferred embodiments, it is to be appreciated that various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A multi-band laser system comprising:
   a plurality of laser modules each configured to emit a radiation band, wherein the radiation band is comprised of a unique center wavelength and spectral bandwidth, and wherein the radiation band of each laser module is directed to be combined at a region of overlap;
   a dispersive element arranged at the region of overlap, configured to receive the radiation band of each laser module and transmit the radiation as a combined multi-band beam; and
   a partially-reflective output coupler arranged to receive the multi-band beam, reflect a portion of the multi-band beam back to the dispersive element and transmit the multi-band beam.

2. The multi-band laser system of claim 1, wherein the transmitted multi-band beam has a broadband spectral range greater than 40 nm.

3. The multi-band laser system of claim 1, wherein a free-space cavity is created between the output coupler and each laser module.

4. The multi-band laser system of claim 1, wherein each of the laser modules are mechanically aligned to direct their respective radiation at various angles onto the dispersive element.

5. The multi-band laser system of claim 1, wherein each of the laser modules are optically aligned to direct their respective radiation at various angles onto the dispersive element.

6. A method for creating a scalable multi-band laser system comprising the steps of:
   providing a plurality of laser modules configured to each produce a unique radiation band, wherein at least one of the laser modules is comprised of a plurality of laser emitters each emitting radiation that is combined at region of overlap on a dispersive element;
   directing the radiation bands from each laser module along a common optical path using at least one dichroic mirror, wherein a multi-band beam is formed; and
   arranging a common output coupler along the common optical path to reflect a portion of the multi-band toward the dichroic mirror and transmit a portion of the multi-band beam.

7. The method of claim 6, wherein the multi-band beam has a broadband spectral range of at least 1 micron.

8. The method of claim 6, wherein the multi-band beam has a total power output greater than 1 kilowatt.

* * * * *